(12) United States Patent
Luo et al.

(10) Patent No.: US 7,345,912 B2
(45) Date of Patent: Mar. 18, 2008

(54) METHOD AND SYSTEM FOR PROVIDING A MAGNETIC MEMORY STRUCTURE UTILIZING SPIN TRANSFER

(75) Inventors: Xiao Luo, Cupertino, CA (US); Eugene Youjun Chen, Fremont, CA (US); Lien-Chang Wang, Fremont, CA (US); Yiming Huai, Pleasanton, CA (US)

(73) Assignees: Grandis, Inc., Milpitas, CA (US); Renesas Technology Corp., Tokyo (JP)

( * ) Notice: Subject to any disclaimer, the term of this patent is extended or adjusted under 35 U.S.C. 154(b) by 111 days.

(21) Appl. No.: 11/446,391

(22) Filed: Jun. 1, 2006

(65) Prior Publication Data

US 2007/0279968 A1    Dec. 6, 2007

(51) Int. Cl.
G11C 11/00 (2006.01)
(52) U.S. Cl. ...................... 365/158; 365/157
(58) Field of Classification Search ................ 365/158, 365/157, 171
See application file for complete search history.

(56) References Cited

U.S. PATENT DOCUMENTS

| | | | | |
|---|---|---|---|---|
| 6,055,178 | A  * | 4/2000 | Naji | 365/158 |
| 6,445,612 | B1 * | 9/2002 | Naji | 365/158 |
| 6,757,191 | B2 * | 6/2004 | Ooishi et al. | 365/171 |
| 6,940,749 | B2 * | 9/2005 | Tsang | 365/171 |
| 6,982,913 | B2 | 1/2006 | Oh et al. | |

OTHER PUBLICATIONS

John DeBrosse, *Circuit Considerations for Spin-Switched MRAM Devices*, Nanotechnology Symposium, May 14, 2004.

John DeBrosse, et al., *A High-Speed 128-kb MRAM Core for Future Universal Memory Applications*, IEEE Journal of Solid State Circuits, vol. 39, No. 4, Apr. 2004.

Eugene Y. Chen, et al., *Current Driven Switching of Magnetic Storage Cells Utilizing Spin Transfer and Magnetic Memories Using Such Cells Having Enhanced Read and Write Margins*, U.S. Appl. No. 11/476,171 (3861P).

Lien-Chang Wang, et al., *Method and System for Providing Current Balanced Writing for Memory Cells and Magnetic Devices*, U.S. Appl. No. 11/286,083 (3735P).

Eugene Y. Chen, et al., *Current Driven Memory Cells Having Enhanced Current and Enhanced Current Symmetry*, U.S. Appl. No. 11/361,267 (3753P).

(Continued)

*Primary Examiner*—Vu A. Le
(74) *Attorney, Agent, or Firm*—Strategic Patent Group, P.C.

(57) ABSTRACT

A method and system for providing a magnetic memory is described. The method and system include providing magnetic memory cells, local and global word lines, bit lines, and source lines. Each magnetic memory cell includes a magnetic element and a selection device connected with the magnetic element. The magnetic element is programmed by first and second write currents driven through the magnetic element in first and second directions. The local word lines are connected with the selection device of and have a first resistivity. Each global word line corresponds to a portion of the local word lines and has a resistivity lower than the first resistivity. The bit lines are connected with the magnetic element. The source lines are connected with the selection device. Each source line corresponds to a more than one of the magnetic memory cells and carries the first and second write currents.

17 Claims, 9 Drawing Sheets

OTHER PUBLICATIONS

Eugene Y. Chen, et al., *Current Driven Switched Magnetic Storage Cells Having Improved Read and Write Margins and Magnetic Memories Using Such Cells*, U.S. Appl. No. 11/260,778 (3725P).

Eugene Y. Chen, et al., *Current Driven Switching of Magnetic Storage Cells Utilizing Spin Transfer and Magnetic Memories Using Such Cells*, U.S. Appl. No. 11/217,524 (3691P).

Eugene Y. Chen, et al., *Current Driven Switching of Magnetic Storage Cells Utilizing Spin Transfer and Magnetic Memories Using Such Cells*, U.S. Appl. No. 11/217,258 (3671P).

Lien-Chang Wang, et al., *Magnetic Devices Having A Hard Bias Field and Magnetic Memory Devices Using the Magnetic Devices*, U.S. Appl. No. 11/192,811 (3648P).

Zhitao Diao et al., *Fast Magnetic Memory Devices Utilizing Spin Transfer and Magnetic Elements Used Therein*, U.S. Appl. No. 11/147,944 (3557P).

Zhenghong Qian et al., *Circuitry For Use in Current Switching A Magnetic Cell*, U.S. Appl. No. 11/096,626 (3525P).

\* cited by examiner

METHOD AND SYSTEM FOR PROVIDING A MAGNETIC MEMORY STRUCTURE UTILIZING SPIN TRANSFER

FIELD OF THE INVENTION

The present invention relates to magnetic memory systems, and more particularly to a method and system for providing a memory, magnetic storage cells and/or read and/or write schemes having an improved write characteristics

BACKGROUND OF THE INVENTION

Figure 1:
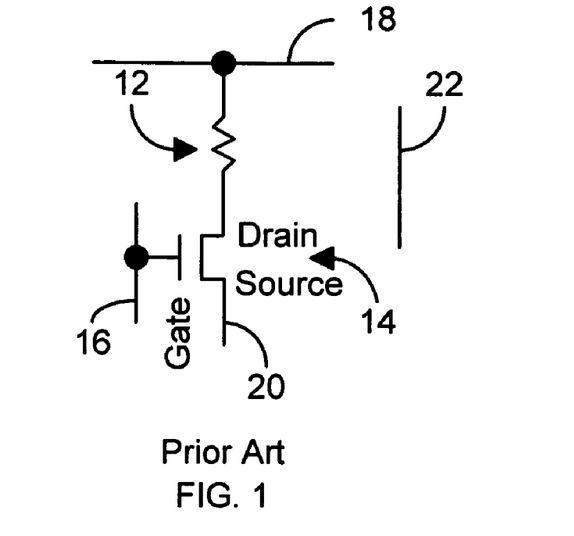
FIG. 1 is a diagram of a portion of a conventional magnetic RAM memory.

FIG. 1 depicts a small portion of a conventional magnetic random access memory (MRAM) 1. The conventional MRAM 1 includes a magnetic storage cell 10 having a conventional magnetic element 12 that is typically a conventional magnetic tunneling junction (MTJ) 12, and a conventional selection device 14 that is typically an NMOS transistor 14. Also depicted are a conventional read word line 16, a conventional bit line 18, a conventional source line 20, and a conventional write word line 22. Data are stored in the conventional magnetic element 12 by programming the conventional magnetic element to be in a high resistance state or a low resistance state. Typically, a high resistance corresponds to a logical "1" and a low resistance corresponds to a logical "0". However, it is possible that the low resistance could correspond to the logical "1" while the high resistance corresponds to a logical "0". The transistor 14 is used as a "select device" for the read operation.

In order to write to the conventional magnetic memory cell 10, a magnetic field is typically used. This magnetic field (switching field) is sufficient to switch the conventional MTJ 12 between the high and low resistance states. Thus programming is typically performed by applying magnetic fields from current pulses flowing in both the bit line 18 and the write word line 22. In general, the magnetic field generated by current flowing in either the bit line 18 or the write word line 22 alone is insufficient to program the conventional magnetic element 12. However, in combination the bit line 18 and the write word line 22 generate the switching field at their cross point, the location of the conventional MTJ 12. The state to which the conventional MTJ 12 is written depends on the direction of the current flow through the conventional bit line 18 and conventional write word line 22.

The conventional magnetic element 12 is read by activating the selection transistor 14 using the read word line 16 and driving a read current through the conventional magnetic element using the corresponding bit line 18. In a memory array, only the conventional MTJ 12 at the cross point between the selected bit line 18 and the selected read word line 16 has current driven through it. Consequently, only this MTJ 12 is read. The magnitude of the read current through the selected bit line 18 depends upon the state (resistance) of the conventional MTJ 12. The read current through the conventional MTJ 12 is compared with that of the reference cell by a differential current sensor amplifier, as shown in FIG. 2, which produces different outputs for the states "1" and "0".

Figure 2:
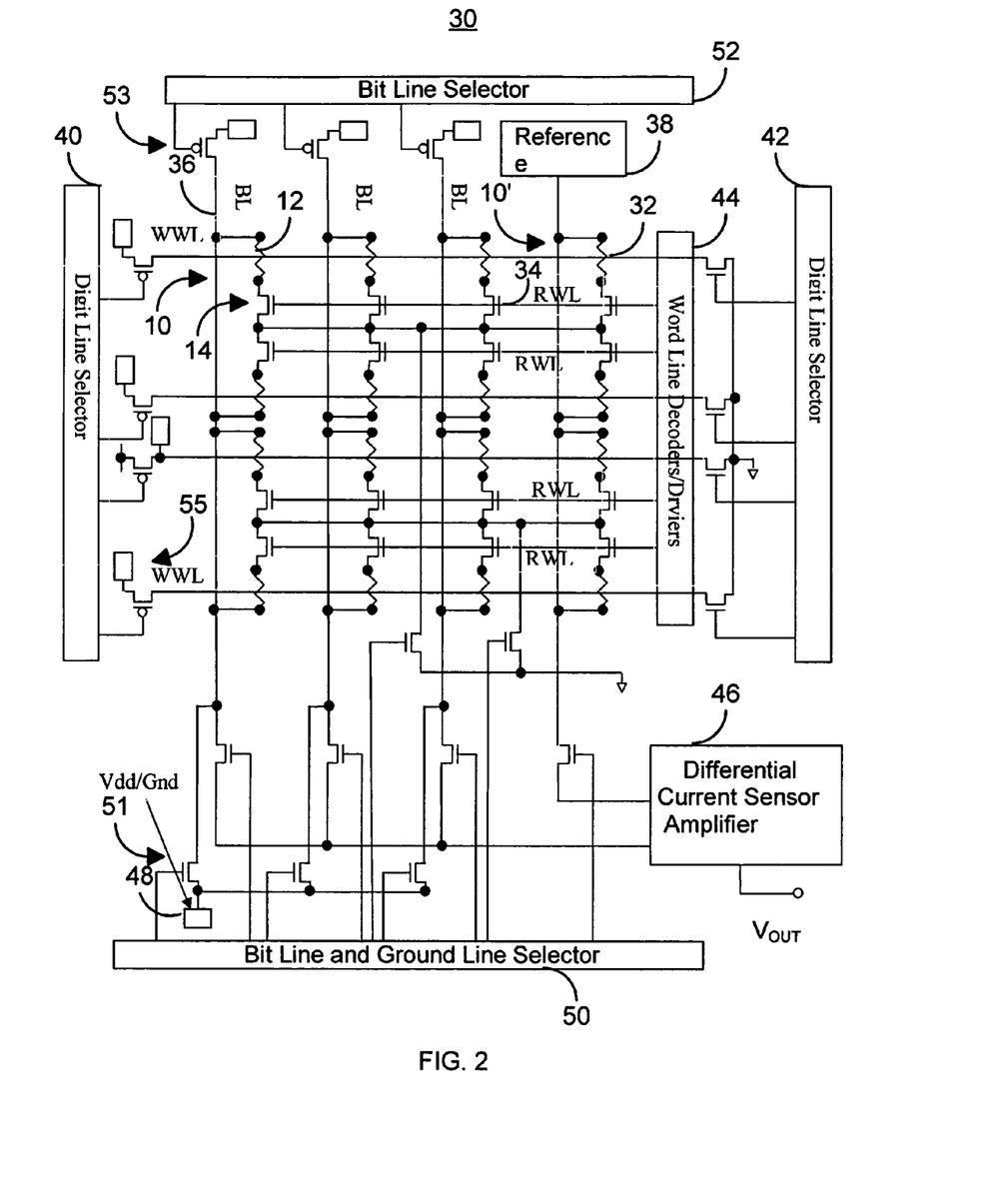
FIG. 2 is a diagram of a larger portion of a conventional magnetic RAM memory.

FIG. 2 depicts a larger portion of a conventional MRAM array 30 that utilizes conventional magnetic memory cells such as the conventional memory cell 10 depicted in FIG. 1. Referring back to FIG. 2, the conventional magnetic storage cells 10 are arranged in rows and columns. Each conventional magnetic memory cell 10 is still associated with conventional bit lines 36 (corresponding to bit lines 18), conventional read word lines 34 (corresponding to read word line 16) and conventional write word lines 32. Also depicted are a conventional word line decoders/drivers 44, conventional digit line (write word line) selectors 40 and 42, a conventional bit line and ground line selector 50, a conventional bit line selector 52, a conventional differential current sensor amplifier 46, a reference column 38, a voltage supply/ground 48, and conventional transistors 51, 53, and 55. The read word lines 34 are connected to and enabled by the conventional word line decoders/drivers 44. Each write word line 32 may also be controlled by the conventional digit line selectors 40 and 42. The conventional bit lines 36 are connected to the conventional bit line selector 52 and the conventional bit and ground line selector 50. The conventional digit line selector 40, conventional bit line selector 52, and conventional bit and ground line selector 50 are connected to the gates of MOS transistors 51, 53, and 55. The transistors 51, 53, and 55 act as switches that connect the bit lines 36 and write word lines 32 to the power supply or ground. Consequently, the current flow in conventional bit line 36 and conventional write word line 32 is controlled during the write operations. The conventional word line decoders/drivers 44 and the bit line and ground line selector 50 control the read operations.

The conventional MRAM is programmed and read in a similar manner to the single magnetic memory cell 10 described above. During a program, or write operation, a bit line 36 is activated and carries a current that generates a portion of the switching field for the conventional MTJ 12. In addition, a corresponding write word line 32 is activated and carries a current that generates a remaining portion of the switching field. In most conventional MRAM 30, neither the magnetic field generated using the bit line 36, nor the magnetic field generated by the write word line 32 is alone sufficient to program, or switch the state of, any conventional magnetic element 12. However, in combination the bit line 36 and the write word line 32 can generate the switching field at their cross point. Consequently, a selected conventional magnetic element 12 can be written.

During a read operation, a read word line 34 and a corresponding bit line 36 containing the magnetic element to be read are activated. Only the conventional magnetic storage cell 10 at the cross point between the activated bit line 36 and the activated read word line 34 has current driven through it and, therefore, read. The resistance state of the conventional magnetic storage cell being read is compared to the reference cell 10' using the differential current sensor 46, which compares the two current signals and produces an output $V_{out}$ for memory state "1" or "0".

Although the conventional magnetic storage cell 10 and the conventional MRAM 30 function, one of ordinary skill in the art will readily recognize that there are drawbacks. These drawbacks may be particularly severe for higher memory densities. The write operation depends upon magnetic fields generated by current driven through the corresponding bit lines 18/36 and write word lines 22/32. These magnetic fields are not a localized phenomenon. Consequently, the magnetic fields may affect other nearby conventional memory cells 10. In addition, a relatively large current corresponding to a relatively large magnetic field is used to write the conventional MTJ 12. Consequently, the conventional magnetic memory cells 10 that are not selected for writing may be disturbed or inadvertently written. Although this problem may be solved by using an advanced architecture called toggle writing, toggle writing raises different issues. Typically, toggle writing utilizes much higher magnetic field and, therefore, a significantly higher current. Thus, power consumption is greatly increased, which is undesirable. Moreover, toggle writing typically requires a read verification prior to actual writing. A total access time is, therefore, longer. This greater access time also makes toggle writing unattractive for high speed applications. In addition the above concerns, the current generation memory cell size for conventional a MRAM 30 that utilizes toggle writing is close to $40f^2$, where f is the lithographic critical dimension. Although this size range is competitive with semiconductor memory SRAM, MRAM typically requires five to seven more masks for fabrication. As a result, the conventional MRAM may cost more than SRAM.

Accordingly, what is desired is a method and system for providing and utilizing magnetic memory cells which mitigates or eliminates the issues related memory cells employing spin transfer based switching with a reduced possibility of inducing dielectric breakdown in the conventional magnetic element 12. The present invention addresses such a need.

BRIEF SUMMARY OF THE INVENTION

The present invention provides a method and system for providing a magnetic memory. The method and system comprise providing magnetic memory cells, local word lines, global word lines, bit lines, and source lines. Each of the plurality of magnetic memory cells includes a magnetic element and a selection device connected with the magnetic element. The magnetic element is programmed by a first write current driven through the magnetic element in a first direction and a second write current driven through the magnetic element in a second direction. The plurality of local word lines is connected with the selection device of a first portion of the plurality of magnetic memory cells. Each of the local word lines has a first resistivity. Each of the plurality of global word lines corresponds to a portion of the plurality of local word lines and has a second resistivity lower than the first resistivity. The plurality of bit lines is connected with the magnetic element of each of the plurality of magnetic memory cells. The plurality of source lines is connected with the selection device of each of the plurality of magnetic storage cells. Each of the plurality of source lines corresponds to a second portion of the plurality of magnetic memory cells and carries the first write current and the second write current. The second portion of the plurality of magnetic memory cells includes more than a single magnetic memory cell.

According to the method and system disclosed herein, the present invention provides a magnetic memory that utilizes a more localized phenomenon for writing and has improved efficiency in area usage and access time.

DETAILED DESCRIPTION OF THE INVENTION

The present invention relates to a magnetic memory. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown, but is to be accorded the widest scope consistent with the principles and features described herein.

Figure 3:
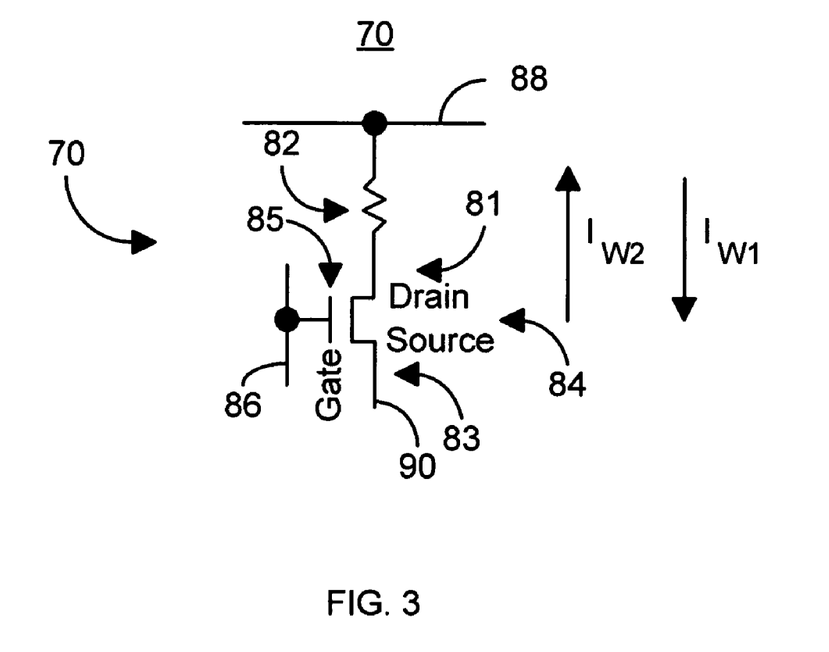
FIG. 3 is a diagram of a portion of a magnetic memory written utilizing a current driven through the magnetic element.

FIG. 3 depicts a small portion of a conventional spin transfer torque magnetic random access memory (STT-MRAM) 70. The STT-MRAM 70 is more recently developed and utilizes spin transfer as a mechanism for switching the state of the magnetic storage cell. The conventional magnetic STT-MRAM 70 includes a conventional magnetic memory cell 80 including a magnetic element 82 and a selection device 84. The selection device 84 is generally a transistor such as a NMOS transistor and includes a drain 81, a source 83, and a gate 85. Also depicted are a word line 86, a bit line 88, and source line 90. The word line 86 is oriented perpendicular to the bit line 88. The source line 90 is typically either parallel or perpendicular to the bit line 88, depending on specific architecture used for the STT-MRAM 70. However, in other STT-MRAMs, the orientations of bit lines, word lines, and source lines may differ. The bit line is connected to the magnetic element 82, while the source line 90 is connected to the source 83 of the selection device 84. The word line 86 is connected to the gate 85.

In contrast to the technology used in conventional MRAM 10/30, the STT-MRAM 70 programs the magnetic memory cell 80 by current flowing through the cell. In particular, the magnetic element 82 is configured to be changeable between high and low resistance states by driving a current through the conventional magnetic element 82. The current is spin polarized when passing through the magnetic element 82 and changes the state of the magnetic element 82 by the spin transfer effect. For example, the magnetic element 82 may be a MTJ configured to be written using the spin transfer effect. Typically, this is achieved by ensuring that the magnetic element 82 has, for example, a sufficiently small cross-sectional area as well as other features desirable for switching using the spin transfer effect. When the current density is sufficiently large, the current carriers driven through the magnetic element 82 may impart sufficient torque to change the state of the magnetic element 82. When the write current is driven in one direction, the state may be changed from a low resistance state to a high resistance state. When the write current is driven in the opposite direction, the state may be changed from a high resistance state to a low resistance state.

During write operations, the word line 86 is high and turns on the selection device 84. The write current flows either from the bit line 88 to the source line 90, or vice versa, depending upon the state to be written to the magnetic memory cell 80. During read operations, the word line 86 is high, thereby enabling the selection device 84. Consequently, a read current flows from the bit line 88 to the source line 90.

Thus, STT-MRAM 70 has a simpler structure in comparison to the conventional MRAM 10/30. Because the magnetic element 82 is programmed by a current driven through the magnetic element 82, the STT-MRAM 70 has better cell scalability, lower current of writing memory cells 80, does not suffer from the problem of write disturbance to the neighboring memory cells and smaller cell size for high memory density.

Although the STT-MRAM 70 has advantages, one of ordinary skill in the art will readily recognize that the STT-MRAM 70 is to be incorporated into a larger memory. In so doing, it is desirable to ensure that the memory remains appropriate for higher density applications and preferably for high speed applications.

The present invention provides a method and system for providing a magnetic memory. The method and system comprise providing magnetic memory cells, local word lines, global word lines, bit lines, and source lines. Each of the plurality of magnetic memory cells includes a magnetic element and a selection device connected with the magnetic element. The magnetic element is programmed by a first write current driven through the magnetic element in a first direction and a second write current driven through the magnetic element in a second direction. The plurality of local word lines is connected with the selection device of a first portion of the plurality of magnetic memory cells. Note that in implementations, the gate of the selection device is part generally of the local word line. Each of the local word lines has a first resistivity. Each of the plurality of global word lines corresponds to a portion of the plurality of local word lines and has a second resistivity lower than the first resistivity. The plurality of bit lines is connected with the magnetic element of each of the plurality of magnetic memory cells. The plurality of source lines is connected with the selection device of each of the plurality of magnetic storage cells. Each of the plurality of source lines corresponds to a second portion of the plurality of magnetic memory cells and carries the first write current and the second write current. The second portion of the plurality of magnetic memory cells includes more than a single magnetic memory cell.

The present invention is described in the context of particular magnetic memories having certain components, such magnetic storage cells having magnetic elements including particular components and particular isolation devices. One of ordinary skill in the art will readily recognize that the present invention is consistent with the use of magnetic memories having other and/or additional components. The method and system in accordance with the present invention are also described in the context of reading from, writing to, or providing a single magnetic storage cell. However, one of ordinary skill in the art will readily recognize that the method and system can be extended to read from, write to, and/or provide multiple magnetic storage cells substantially in parallel. Finally, the present invention is described in the context of certain memories. However, one of ordinary skill in the art will readily recognize that the present invention is compatible with memories and other devices not inconsistent with the present invention. For example, the present invention is described in the context of an array including rows, columns, and particular components aligned with the rows or columns. However, one of ordinary skill in the art will readily recognize that the rows and columns could be interchangeable, and/or particular components could be aligned with other structures.

Figure 4:
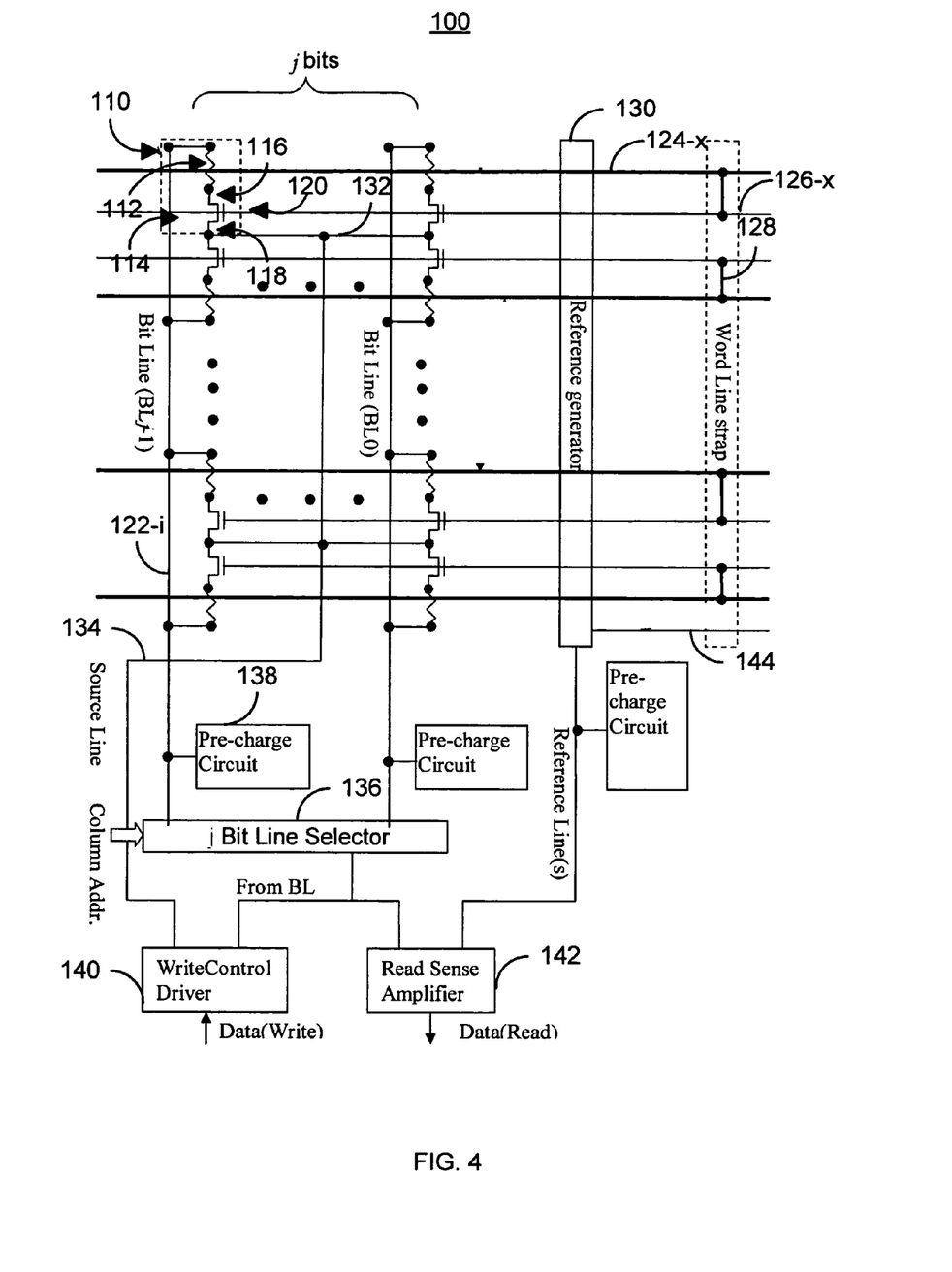
FIG. 4 is a diagram of one embodiment of a portion of a magnetic memory in accordance with the present invention utilizing spin transfer in switching.

To more particularly describe the method and system in accordance with the present invention, refer to FIG. 4, depicting of a portion of one embodiment of a magnetic memory 100 in accordance with the present invention. The magnetic memory 100 is an STT-MRAM. The magnetic memory 100 includes magnetic memory cells 110 arranged in an array including m rows and j columns. The values of j and m may vary and that generally depend on memory architecture design. For clarity, only one magnetic memory cell 110 is denoted. Each magnetic memory cell 110 includes a magnetic element 112 capable of being programmed using spin transfer and a selection device 114. The magnetic element 112 is also read by driving a read current through the magnetic element 112. Thus, the magnetic element 112 is analogous to the magnetic element 82. In a preferred embodiment, the magnetic element 112 is an MTJ configured to be written using the spin transfer effect. The selection device 114 is preferably a NMOS transistor and includes a drain 116, a source 118, and a gate 120.

The magnetic memory 100 also includes bit lines 122-$i$ where i is from 0 to j-1, and word lines 124-$x$ and 126-$x$ where x is from 0 to m-1, conductor 128, reference line(s) 130, connector 132, source line 134, bit line selector 136, pre-charge circuits 138, write control driver(s) 140, read sense amplifier(s) 142 and reference select line 144. Although the pre-charge circuits 138 are depicted as being connected between the bit line selector 136 and the bit lines 122-$i$, in an alternate embodiment, the bit line selector 136 may be connected between the bit lines 122-$i$ and the pre-charge circuits 138. In such an embodiment, the pre-charge circuit 138 may be connected between the bit line selector 136 and the components 140 and 142. The reference line(s) 130 generate a reference voltage and may, for example, include cells analogous to the magnetic memory cell 110. The word line 124-$x$ is a global word line 124-$x$ that is preferably metal. The word line 126-$x$ is a local word line 126-$x$ that is preferably polysilicon. Thus, the resistivity of the global word line 124-$x$ is less than the resistivity of the local word line 126-$x$. Each local word line 126-$x$ is connected to a global word line 124-$x$, preferably using a word line strap 128.

In the magnetic memory 100, the gate 120 of each selection device 114 is connected to a local word line 126-$x$. The magnetic element 112 of a magnetic memory cell 110 is connected to a bit line 122-$i$. In a preferred embodiment, all the sources 118 of the selection devices 114 in the block are tied to the source line 134, preferably using conductors such as lines 132. The global word lines 124-$x$ are connected to the local word lines 126-$x$ by vias or contacts (not explicitly shown) in the word line strap 128. The global word lines 124-$x$ are preferably metal lines having a low resistance. In contrast, the local word lines 126-$x$ are preferably polysilicon having a relatively high resistance. Thus, the resistivity of the global word lines 124-$x$ is preferably less than that of the local word lines 126-$x$. In particular, the ratio of the resistance of the local word lines 126-$x$ is to the resistance of the global word lines 124-$x$ is preferably greater than one hundred.

The power supply lines (not explicitly shown in FIG. 4) and the well contacts (not explicitly shown in FIG. 4) are preferably located in the word line strap 128. Consequently, the power, supply voltage VDD, and ground are supplied to each block in the memory 100.

In the magnetic memory 100, the source line 134 directly connects to the write control driver 140. During write operations, the common source line is driven low or high by the write control driver 140, depending on whether a logical "0" or "1" is being written. During read operations, the write control driver 140 connects the source line 134 to ground. Also during a read operation, the read sense amplifier 142 receives the signal from the selected bit line 122.

The magnetic memory 100 has several advantages. Because the state of the magnetic element 112 is changed by driving a current through the magnetic element 112, a more localized phenomenon is used. Thus, issues due to write disturbances may be eliminated. Because of the use of the common source line 134, the area utilized by the magnetic memory can be reduced. Furthermore, the common source line is connected directly to the write control driver 140, which sets the appropriate voltages for the source line 134, as discussed below. Consequently, the common source line 134 can be low or high, depending on the data written and connected to ground during a read operation. As a result, the use of transistors as switches between memory cells and write drivers may be avoided. This reduces the "crowd" area and makes the implementation of the array much easier to fabricate. Furthermore, the combination of the global word lines 124-$x$ and local word lines 126-$x$ reduces the local word line 126-$x$ rise/fall time by reducing the maximum resistance for the local word line 126-$x$ delay. Consequently, the magnetic memory 100 may utilize less area, be more suitable for high density applications, and be capable of a higher speed. The magnetic memory 100 may thus be capable of having fewer issues due to write disturbance, a higher memory density, better memory cell scalability, improved efficiency of area usage, and faster access times.

Figure 5:
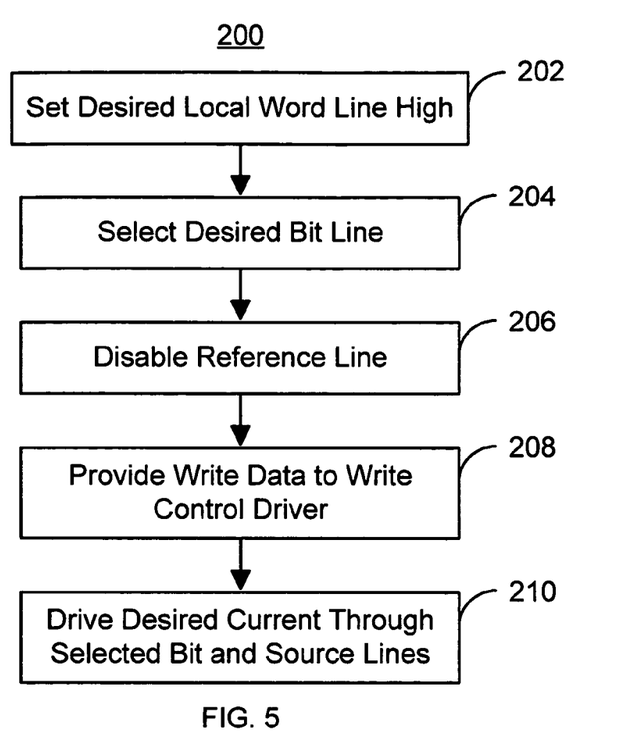
FIG. 5 is a flow-chart depicting one embodiment of a method for programming a magnetic memory in accordance with the present invention.

FIG. 5 is a flow-chart depicting one embodiment of a method 200 programming a magnetic memory in accordance with the present invention. The method 200 is described in the context of the magnetic memory 100. In addition, although described as a flow of steps, one of ordinary skill in the art will recognize that at least some of the steps may be performed in a different order, including simultaneously. In addition, it is assumed that the magnetic memory cell 110 corresponding to the cross point of bit line 122-($j$-1), global word line 124-($m$-1) and local word line 126-($m$-1) is selected for writing.

During the write operation, the local word line 126-($m$-1) is set high, via step 202. Consequently, the selection transistor 114 is activated. The bit line selector 136 selects the bit line 122-($j$-1), via step 204. Also during the write operation, the reference select line 144 is held low, via step 206, to disable the reference line 130. The data for the write operation is provided to the Write Control Driver 140, via step 208. Thus, the write control driver then drives the write current either through the selected bit line 122-($j$-1) to the source line 134 via the selected magnetic memory cell or through the source line 134 to the bit line 122-($j$-1), via step 210. Thus, in step 210 the source line 134 may be held at either a high voltage or a low voltage and the bit line 122-($j$-1) is held at a low voltage or a high voltage, respectively.

Figure 6:
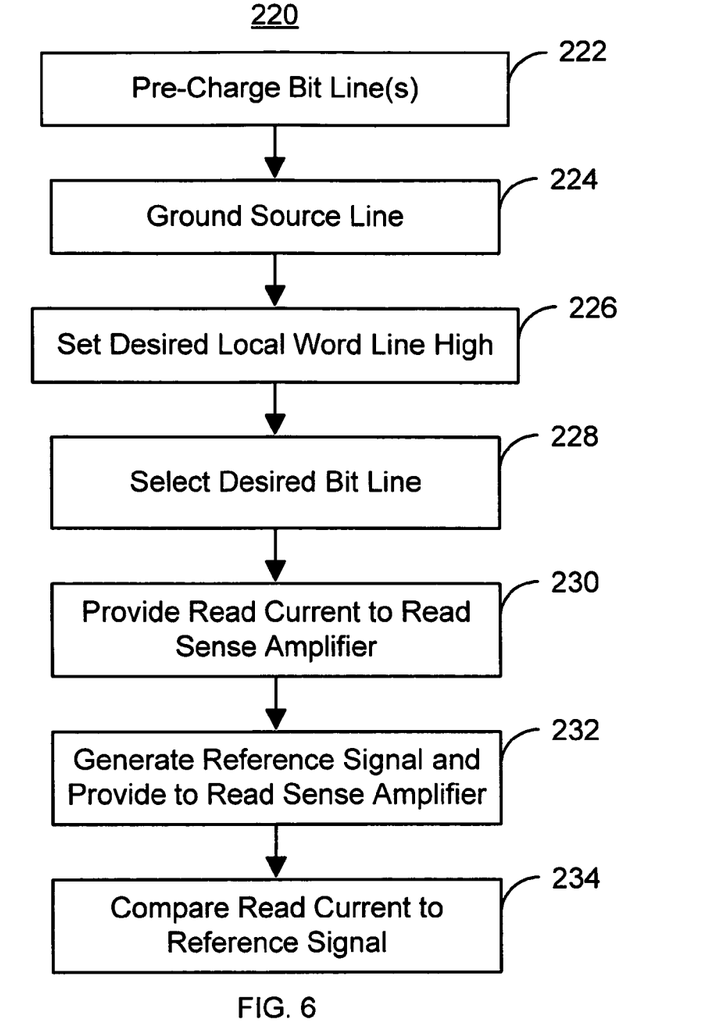
FIG. 6 is a flow-chart depicting one embodiment of a method for reading a magnetic memory in accordance with the present invention.

FIG. 6 is a flow-chart depicting one embodiment of a method 220 reading a magnetic memory in accordance with the present invention. The method 220 is described in the context of the magnetic memory 100. In addition, although described as a flow of steps, one of ordinary skill in the art will recognize that at least some of the steps may be performed in a different order, including simultaneously. In addition, it is assumed that the magnetic memory cell 110 corresponding to the cross point of bit line 122-($j$-1), global word line 124-($m$-1) and local word line 126-($m$-1) is selected for writing.

During the read operations, at least the bit line 122-($j$-1) is pre-charged to a high voltage using the pre-charge circuit 138, via step 222. The source line 134 is set to ground using the write control driver 140, via step 224. The appropriate local word line 126-($m$-1) are set high, via step 226. The appropriate bit line 122-($j$-1) is selected by the bit line selector 136, via step 228. Step 228 includes controlling the bit line selector 136 using signals from a column address decoder (not shown). In a preferred embodiment, current thus the bit line 122-($j$-1) through the selected magnetic memory cell 110 and to source line 134, which is connected to the ground. The current is also provided to the read sense amplifier 142, via step 230. A reference value is also generated and provided to the read sense amplifier 142, via step 232. Step 232 preferably includes selecting the reference line 130 using the reference select line 144 and generating a reference current using the reference line 130. The current generated by the magnetic storage cell 110 is compared to the reference signal, via step 234. Step 234 is preferably performed using the read sense amplifier 142, which outputs the data according to the difference between the bit line current and the reference line current.

Thus, using the methods 200 and 220, the magnetic memory 100 may be programmed and read. Consequently, advantages of the magnetic memory 100 may be achieved.

Figure 7:
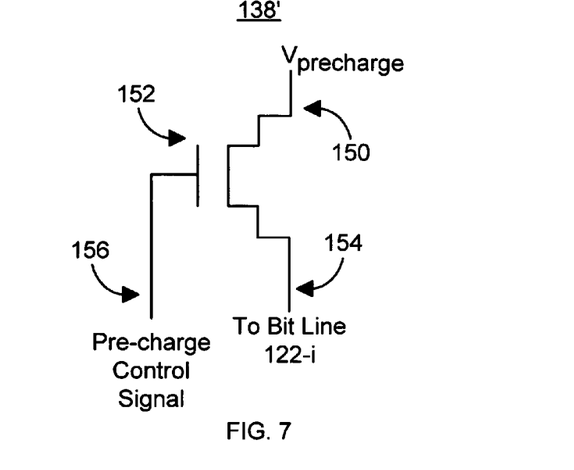
FIG. 7 is a diagram of one embodiment of a pre-charge circuit in accordance with the present invention.

As described above, the bit line 122-$i$ is pre-charged during a read operation. FIG. 7 is a diagram of one embodiment of a pre-charge circuit 138' in accordance with the present invention. The pre-charge circuit 138' might be used for one or more of the pre-charge circuits 138 depicted in FIG. 4. Referring back to FIG. 7, the pre-charge circuit 138' includes an input 150, an output 154, a NMOS transistor 152, and is enabled by enable line 156. In a preferred embodiment, each bit line 122-$i$ has an associated pre-charge circuit 138, which may be implemented as the pre-charge circuit 138'. Alternatively, the bit line selector may be located between the bit line and the pre-charge circuit 138/138'. Before a selected global word line 124-$x$ rises to high, the pre-charge circuit 138' pre-charges the bit lines 122-$i$ to the voltage provided to the input 150, $V_{precharge}$. Otherwise, the bit lines 122-$i$ are cut off. The voltage $V_{precharge}$ might be any voltage, such as $V_{DD}$ or half of $V_{DD}$. The selection of the voltage may depend upon the requirements of the read sense amplifier 142.

In general, there are two ways that the pre-charge operation might be controlled. The first is simply to connect all the pre-charge circuits 138/138' together to a common pre-charge control signal provided by the enable line 156. In such an embodiment, the pre-charge control signal is high and all the bit lines 122-$i$ are pre-charged to $V_{precharge}$ by the transistor 152. Before the selected global word line 124-$x$ rises to its final voltage, the pre-charge control signal provided to the enable line 156 is low to cut off. Using this scheme is simpler. The second mechanism connects each memory cell 110 to the associated bit line selection in the bit line selector 136. Before the read operation, only the selected bit line 122-*i* for the read is charged to the voltage $V_{precharge}$ by the pre-charge control signal provided over the line 156. Other unselected pre-charge circuits 138/138' are cut off. Although this scheme is more complicated, it may utilize less power during the read operation.

Figure 8:
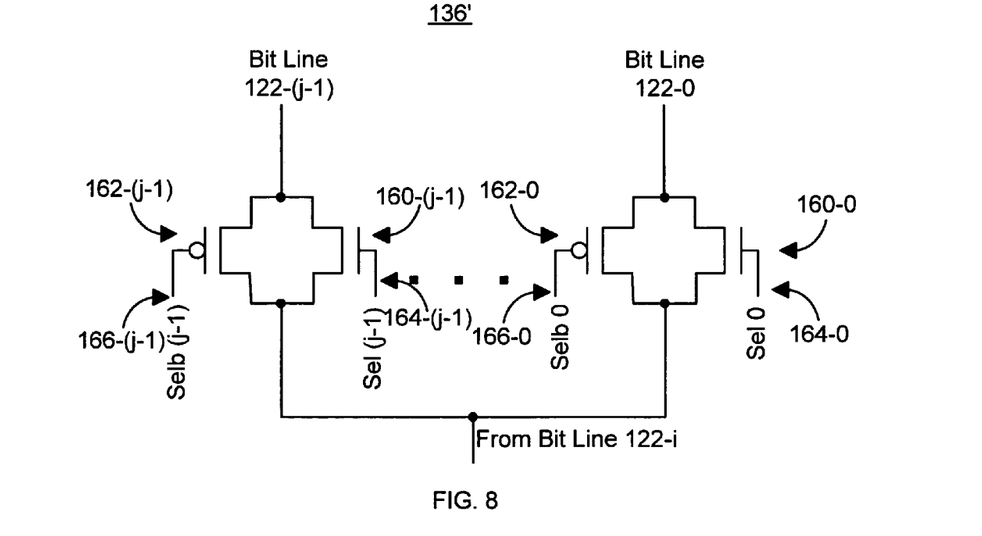
FIG. 8 is a diagram of one embodiment of a bit line selector in accordance with the present invention.

FIG. 8 is a diagram of one embodiment of a bit line selector 136' in accordance with the present invention. The bit line selector 136' might be used for the bit line selector 136 in FIG. 4. Referring to FIGS. 4 and 8, the bit lines selector 136' selects which of the bit lines 122-*i* is connected to the write control driver 140 for write operations or the read sense amplifier 142 for read operations. In the bit line selector 136 there are j transistor pairs 160-*i* and 162-*i* where i is from 0 to j-1. On transistor 162-*i* is a P-type transistor, while the other transistor 160-*i* is an N-type transistor. However, in another embodiment, the transistors types could be switched. In addition, there are j pairs of bit select lines 164-*i* and 166-*i*, where i is from 0 to j-1, that correspond to the transistor pairs 160-*i* and 162-*i*. The select lines 164-*i* and 166-*i* carry complementary signals, which are from a column decoder (not shown). Based on the select lines 164-*i* and 166-*i*, the bit line selector 136' enables the desired bit line 122-*i*. Thus, the bit line selector 136' can be used for write and read operations.

Figure 9:
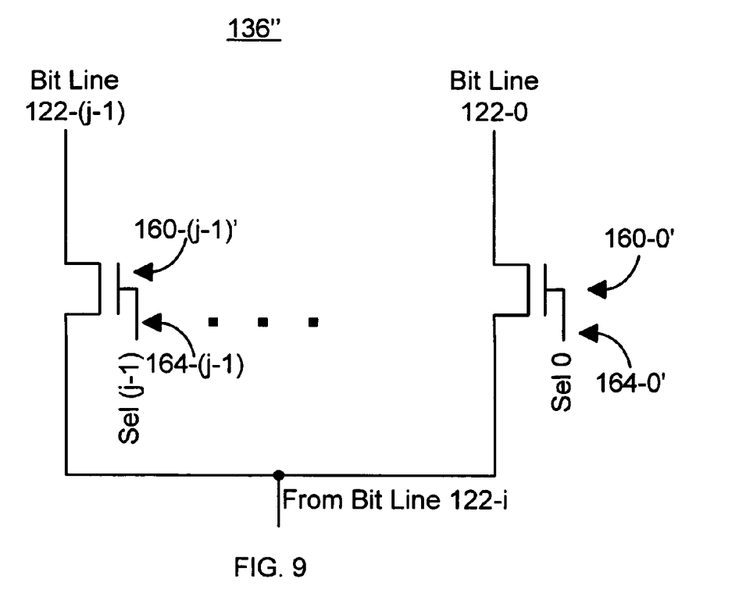
FIG. 9 is a diagram of another embodiment of a bit line selector in accordance with the present invention.

FIG. 9 is a diagram of one embodiment of a bit line selector 136" in accordance with the present invention. The bit line selector 136" might be used for the bit line selector 136 in FIG. 4. Referring to FIGS. 4 and 9, the bit lines selector 136" selects which of the bit lines 122-*i* is connected to the write control driver 140 for write operations or the read sense amplifier 142 for read operations. In the bit line selector 136 there are j transistors 160-*i'*, where i is from 0 to j-1. The transistor 160-*i'* may each be an N-type (NMOS) transistor. However, in another embodiment, the transistors 160-*i'* could be P-type (PMOS). In addition, there are j bit select lines 164-*i'*, where i is from 0 to j-1, that correspond to the transistors 160-*i'*. The select lines 164-*i'* carries a signal from a column decoder (not shown). Based on the select lines 164-*i'*, the bit line selector 136" enables the desired bit line 122-*i*. Because only N-Type devices 160-*i'* are employed, only j select lines 164-*i'* are needed. Consequently, less area may be used. However, a high voltage is applied to the select lines 164-*i'*, and thus the gates of transistors 160-*i'* in order to allow for the full internal supply voltage, $V_{DD}$, to be applied on to bit line 122-*i*. Thus, using the bit line selector 136' or 136" the magnetic memory 100 may be utilized.

Figure 10:
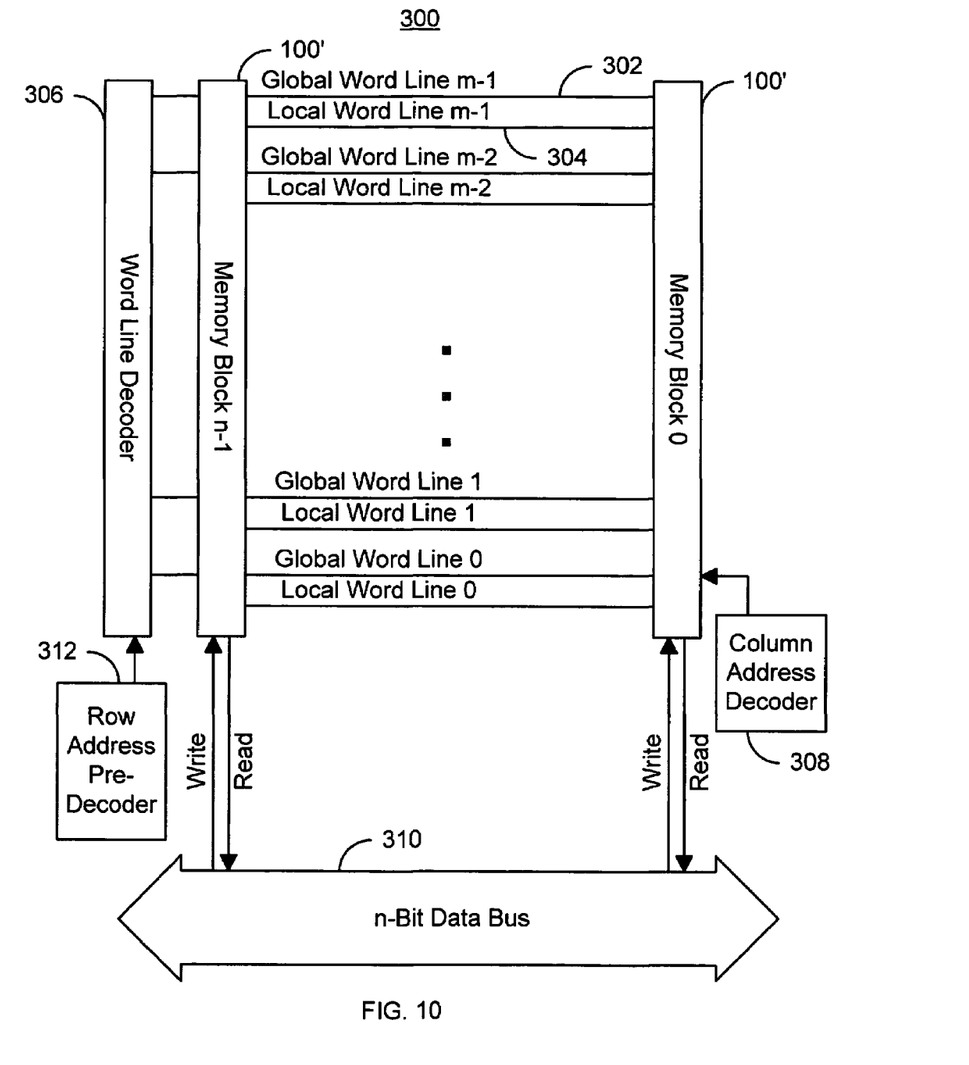
FIG. 10 is a diagram of one embodiment of a magnetic random access memory in accordance with the present invention.

FIG. 10 is a diagram of one embodiment of a magnetic random access memory 300 in accordance with the present invention. The STT-MRAM 300 includes memory blocks 100' that are analogous to the memory 100 depicted in FIG. 4. Also depicted are global word lines 302, local word lines 304, word line decoder 306, column address decoder 308, data bus 310, and row address pre-decoder 312. The global word lines 302 and local word lines 304 correspond to the global word lines 124-*x* and local word lines 126-*x*, respectively. In the embodiment shown, each block provides or receives one data bit to or from, respectively, the data bus 310, which may be uni-directional or bi-directional. The global word lines 302 are connected to the word line decoder 306. The word line decoder 306 receives inputs from the row address pre-decoder 312. When a request to access the memory 300 for a read or write operation is received, the word line decoder 306 selects one of the global word lines 302 and thus local word lines 304 by setting it high. In addition, the column address decoder 308 selects one of the selection signals for the appropriate bit selector(s)(not explicitly shown in FIG. 10) for each memory block 100'. Thus, a bit line (not shown) in each memory block 100' is enabled. Consequently, all of the memory cells (not explicitly shown) corresponding to the word lines 302 and 304 and the selected bit line in each memory block 100' may accessed at substantially the same time. The data may be substantially simultaneously written in or read out, depending on operation mode. After the operation, the selected word line 302 and 304 and the selected selection signal fall to the ground. The access operation of the memory array is finished. Thus, using the magnetic memory 300, the benefits of the magnetic memory 100 may be achieved. In addition, it is noted that multiple bits may be written in parallel.

Figure 11:
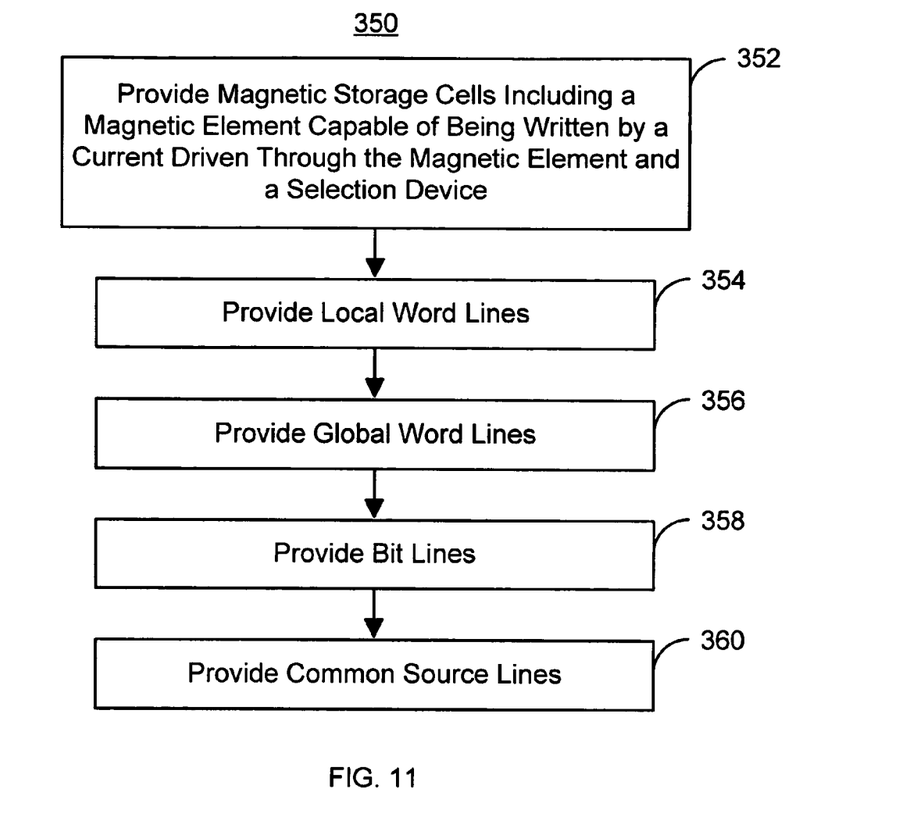
FIG. 11 is a flow-chart depicting one embodiment of a method for providing a magnetic memory in accordance with the present invention.

FIG. 11 is a flow-chart depicting one embodiment of a method 350 for providing a magnetic memory in accordance with the present invention. The method 350 is described in the context of the magnetic memory 100. In addition, although described as a flow of steps, one of ordinary skill in the art will recognize that at least some of the steps may be performed in a different order, including simultaneously.

The magnetic memory cells 110 are provided, via step 352. Step 352 thus includes providing the magnetic element 112 and the selection device 114. The local word lines 126-*x* are provided, via step 354. The global word lines 124-*x* are also provided, via step 356. Steps 354 and 356 include ensuring that the local word lines 126-*x* having a first resistivity and the global word lines 124-*x* have a second resistivity lower than the first resistivity. Steps 354 and 356 also include connecting the local word lines 126-*x* to the gates 120 and to the global word lines 124-*x*. The bit lines 122-*i* are provided, via step 358. Step 358 includes connecting the bit lines 122-*i* to the corresponding magnetic element 112. Source line 134 is provided, via step 360. Note that step 360 may be earlier than some or all of the steps 352, 354, 256, and 358 are completed. Step 360 also includes connecting the source 118 of the selection device 114 of each of magnetic storage cell 110 in a block to the source line. Fabrication of the memory 100 may then be completed. Thus, using the method 350, the magnetic memory 100 and/or 300 may be provided and their benefits achieved.

Thus, magnetic memories 100 and 300 and the methods 200, 220, and 350 provide a magnetic memory capable of having fewer issues due to write disturbance, a higher memory density, better memory cell scalability, improved efficiency of area usage, and faster access times.

A method and system for providing and using a magnetic memory having improved characteristics has been disclosed. The present invention has been described in accordance with the embodiments shown, and one of ordinary skill in the art will readily recognize that there could be variations to the embodiments, and any variations would be within the spirit and scope of the present invention. Accordingly, many modifications may be made by one of ordinary skill in the art without departing from the spirit and scope of the appended claims.

We claim:

1. A magnetic memory comprising:
    a plurality of magnetic memory cells, each of the plurality of magnetic memory cells including a magnetic element and a selection device connected with the magnetic element, the magnetic element being programmed by a first write current driven through the magnetic element in a first direction and a second write current driven through the magnetic element in a second direction;

a plurality of local word lines connected with the selection device of a first portion of the plurality of magnetic memory cells, each of the local word lines having a first resistivity;

a plurality of global word lines, each of the plurality of global word lines corresponding to a portion of the plurality of local word lines and having a second resistivity lower than the first resistivity;

a plurality of bit lines connected with the magnetic element of each of the plurality of magnetic memory cells; and a plurality of source lines connected with the selection device of each of the plurality of magnetic storage cells, each of the plurality of source lines corresponding to a second portion of the plurality of magnetic memory cells and carrying the first write current and the second write current, the second portion of the plurality of magnetic memory cells including more than a single magnetic memory cell.

2. The magnetic memory of claim 1 wherein the selection device is a transistor having a source and a gate.

3. The magnetic memory of claim 2 wherein the source of the transistor for the second portion of the plurality of magnetic memory cells is connected with the source line.

4. The magnetic memory of claim 2 wherein the plurality of local word lines are connected with the gate of each of the first portion of the plurality of magnetic memory cells.

5. The magnetic memory of claim 1 wherein the local word line further includes polysilicon.

6. The magnetic memory of claim 5 wherein the global word line includes a metal.

7. The magnetic memory of claim 6 wherein each of the plurality of local word lines are connected to at least one of the plurality of global word lines using a conductive via or contact.

8. The magnetic memory of claim 1 further comprising a write control driver configured to connect the source line to a voltage during write operations and to ground during a read operation.

9. The magnetic memory of claim 1 further comprising:
a plurality of pre-charge circuits connected with the plurality of bit lines and for charging at least one selected bit line of the plurality of bit lines to a pre-charge read voltage.

10. The magnetic memory of claim 9 further comprising:
at least one bit lines selector for selecting the at least one selected bit line.

11. The magnetic memory of claim 10 wherein the at least one bit lines selector further includes a plurality of transistor pairs corresponding to the plurality of bit lines, each transistor pair including an N-type device having a first source and a first drain and a P-type device having a second source and a second drain, the first source being connected with the second source, the first drain being connected with the second drain.

12. The magnetic memory of claim 10 wherein the at least one bit lines selector further includes a transistor corresponding to each of the plurality of bit lines.

13. The magnetic memory of claim 1 further comprising:
at least one bit line selector connected with the plurality of bit lines; and
a plurality of pre-charge circuits connected with the at least one bit line selector and for charging at least one selected bit line of the plurality of bit lines to a pre-charge read voltage.

14. A magnetic memory comprising:
a plurality of magnetic memory cells, each of the plurality of magnetic memory cells including a magnetic element and a transistor connected with the magnetic element, the magnetic element being programmed by a first write current driven through the magnetic element in a first direction and a second write current driven through the magnetic element in a second direction, the transistor having a source, a drain, and a gate, the drain being connected with the magnetic element;

a plurality of local word lines connected with the gate of the transistor of a first portion of the plurality of magnetic memory cells, each of the local word lines including polysilicon and having a first resistivity;

a plurality of global word lines, each of the plurality of global word lines corresponding to a portion of the plurality of local word lines, including metal, and having a second resistivity lower than the first resistivity;

a plurality of bit lines connected with the magnetic element of each of the plurality of magnetic memory cells;

a plurality of source lines connected with the transistor of each of the plurality of magnetic storage cells, each of the plurality of source lines corresponding to a second portion of the plurality of magnetic memory cells and carrying the first write current and the second write current, the second portion of the plurality of magnetic memory cells including more than a single magnetic memory cell;

a write control driver configured to connect each of the plurality of source lines to a voltage during write operations and to ground during a read operation;

a plurality of pre-charge circuits connected with the plurality of bit lines and for charging at least one selected bit line of the plurality of bit lines to a pre-charge read voltage; and at least one bit lines selector for selecting the at least one selected bit line.

15. A method for providing a magnetic memory comprising:
providing a plurality of magnetic memory cells, each of the plurality of magnetic memory cells including a magnetic element and a selection device connected with the magnetic element, the magnetic element being programmed by a first write current driven through the magnetic element in a first direction and a second write current driven through the magnetic element in a second direction;

providing a plurality of local word lines connected with the selection device of a first portion of the plurality of magnetic memory cells, each of the local word lines having a first resistivity;

providing a plurality of global word lines, each of the plurality of global word lines corresponding to a portion of the plurality of local word lines and having a second resistivity lower than the first resistivity;

providing a plurality of bit lines connected with the magnetic element of each of the plurality of magnetic memory cells; and providing a plurality of source lines connected with the selection device of each of the plurality of magnetic storage cells, each of the plurality of source lines corresponding to a second portion of the plurality of magnetic memory cells and carrying the first write current and the second write current, the second portion of the plurality of magnetic memory cells including more than a single magnetic memory cell.

16. A method for utilizing a magnetic memory including a plurality of magnetic memory cells, a plurality of bit lines, and a plurality of reference lines, each of the plurality of magnetic memory cells including a magnetic element and a selection device connected with the magnetic element, the magnetic element being programmed by a first write current driven through the magnetic element in a first direction and a second write current driven through the magnetic element in a second direction, the plurality of bit lines connected with the magnetic element of each of the plurality of magnetic memory cells, the method comprising:

setting to high at least one of a plurality of local word lines corresponding to at least one desired magnetic memory cell of the plurality of magnetic memory cells, the plurality of local word lines connected with the selection device of a first portion of the plurality of magnetic memory cells, each of the plurality of local word lines having a first resistivity and being coupled to one of a plurality of global word lines, each of the plurality of global word lines corresponding to a portion of the plurality of local word lines and having a second resistivity lower than the first resistivity;

selecting at least one of the plurality of bit lines corresponding to the at least one desired magnetic memory cell;

disabling a reference line; and providing data for the at least one desired memory cell to at least one write control driver connected to the at least one bit line such that current is driven through the at least one bit line, the at least one desired memory cell and at least one source line connected to the desired memory cell such that current is driven through the magnetic element of the at least one desired memory cell in the first direction or the second direction.

17. A method for utilizing a magnetic memory including a plurality of magnetic memory cells, a plurality of bit lines, and a plurality of reference lines, each of the plurality of magnetic memory cells including a magnetic element and a selection device connected with the magnetic element, the magnetic element being programmed by a first write current driven through the magnetic element in a first direction and a second write current driven through the magnetic element in a second direction, the plurality of bit lines connected with the magnetic element of each of the plurality of magnetic memory cells, the method comprising:

precharging at least one of the plurality of bit lines corresponding to at least one desired magnetic memory cell;

setting a source line to ground, the source line corresponding to a portion of the plurality of magnetic memory cells including the at least one desired magnetic memory cell;

setting to high at least one of a plurality of local word lines corresponding to the at least one desired magnetic memory cell of the plurality of magnetic memory cells, the plurality of local word lines connected with the selection device of a first portion of the plurality of magnetic memory cells, each of the plurality of local word lines having a first resistivity and being coupled to one of a plurality of global word lines, each of the plurality of global word lines corresponding to a portion of the plurality of local word lines and having a second resistivity lower than the first resistivity;

selecting the at least one of the plurality of bit lines corresponding to the at least one desired magnetic memory cell;

comparing a read current from the at least one desired magnetic memory cell to a reference signal.

* * * * *